United States Patent
Yamanouchi et al.

[11] Patent Number: 6,046,524
[45] Date of Patent: Apr. 4, 2000

[54] ELASTIC SURFACE WAVE FUNCTIONAL DEVICE AND ELECTRONIC CIRCUIT USING THE ELEMENT

[75] Inventors: Kazuhiko Yamanouchi, Sendai; Naohiro Kuze, Fuji; Yoshihiko Shibata, Fuji; Yasuhito Kanno, Fuji, all of Japan

[73] Assignee: Asahi Kasei Kogyo Kabushiki Kaisha, Osaka, Japan

[21] Appl. No.: 08/894,321

[22] PCT Filed: Feb. 16, 1996

[86] PCT No.: PCT/JP96/00339

§ 371 Date: Jul. 22, 1998

§ 102(e) Date: Jul. 22, 1998

[87] PCT Pub. No.: WO96/25792

PCT Pub. Date: Aug. 22, 1996

[30] Foreign Application Priority Data

Feb. 16, 1995 [JP] Japan ............................... 7-028261

[51] Int. Cl.[7] ........................................ H01L 41/08
[52] U.S. Cl. ........................................... 310/313 R
[58] Field of Search ........................................ 310/313 R

[56] References Cited

U.S. PATENT DOCUMENTS

| | | | |
|---|---|---|---|
| 3,675,140 | 7/1972 | Fang et al. ........................... | 333/70 |
| 3,851,280 | 11/1974 | Staples .................................. | 333/30 R |
| 4,019,200 | 4/1977 | Adkins et al. ........................ | 357/26 |
| 4,047,214 | 9/1977 | Francombe et al. ................. | 357/23 |
| 4,745,378 | 5/1988 | Niitsuma et al. .................... | 333/196 |
| 5,221,870 | 6/1993 | Nakahata et al. .................... | 310/313 A |
| 5,320,977 | 6/1994 | Tanski et al. ......................... | 310/313 R |
| 5,338,999 | 8/1994 | Ramakrishnan et al. ............ | 310/358 |
| 5,440,189 | 8/1995 | Nakahata et al. .................... | 310/313 R |
| 5,442,192 | 8/1995 | Goronkin et al. .................... | 257/10 |

*Primary Examiner*—Thomas M. Dougherty
*Attorney, Agent, or Firm*—Finnegan, Henderson, Farabow, Garrett & Dunner, L.L.P.

[57] ABSTRACT

A surface acoustic wave functional element is provided that includes a piezoelectric substrate or a multilayer piezoelectric substrate having a large electromechanical coupling coefficient. Semiconductor layers are formed on the piezoelectric substrate. The semiconductor layers include an active layer and a buffer layer. The buffer layer is formed of a structure that has a lattice constant that is the same as or similar to that of the active layer. In addition, input and output electrodes are formed on both sides of the semiconductor layers. The surface acoustic wave functional element attains a large amplification gain at low voltage, and can be used as part of a transmitting/receiving circuit in a high frequency portion of a mobile communication device.

17 Claims, 6 Drawing Sheets

ELASTIC SURFACE WAVE FUNCTIONAL DEVICE AND ELECTRONIC CIRCUIT USING THE ELEMENT

TECHNICAL FIELD

The present invention relates to surface acoustic wave functional elements, such as a surface acoustic wave amplifier and a surface acoustic wave convolver, in which surface acoustic waves propagating in a piezoelectric substrate interact with carriers in a semiconductor, and to an electronic circuit including such a surface acoustic wave functional element.

BACKGROUND ART

Recently, a mobile communication apparatus such as a portable telephone has been down-sized and devised to operate at lower voltages with reduced power consumption. With this progress, intensive investigation has been made to develop monolithic elements which can be mounted in a portable apparatus. However, since a bandpass filter and a duplexer are bigger in size than other high frequency components, there is little advantage to fabricate these elements monolithically together with other elements. Moreover, it is very difficult to fabricate a power amplifier as a monolithic element. For this reason, a duplexer, a power amplifier, a bandpass filter, a low noise amplifier arranged upstream of the bandpass filter, etc. have been developed as respective discrete elements and fabricated as respective modules. When these discrete elements are fabricated as modules, wiring for connecting a plurality of parts and circuitry for matching impedance are formed, and therefore the discrete elements as units are very large in size.

On the other hand, there have been made various studies on amplification of surface acoustic waves. In order to amplify the surface acoustic wave, it is known to propagate the surface acoustic wave in a surface of a piezoelectric substrate and couple the electric field generated by the wave with carriers in a semiconductor. Actual surface acoustic wave amplifiers are classified into three types according to the types of combination of the piezoelectric material for propagating the surface acoustic wave and the semiconductor: (1) a direct type amplifier (FIG. 3); (2) a separation type amplifier (FIG. 4); and (3) a monolithic type amplifier (FIG. 5). As shown in FIG. 3, the direct type amplifier is an amplifier having the structure which has a substrate 7 composed of a material, such as CdS or GaAs, with both piezoelectric characteristics and semiconductor characteristics simultaneously, on which input and output electrodes 4 and 5 are provided, with the substrate 7 being sandwiched by electrodes 6 for applying a direct current electric field to the substrate 7. However, a piezoelectric semiconductor with large piezoelectric properties and large mobility has not been found so far. As shown in FIG. 4, the separation type amplifier is an amplifier having the structure in which a semiconductor 3' of a large mobility is disposed on a piezoelectric substrate 1 of large piezoelectric property with a gap 8. Input and output electrodes 4 and 5 are provided on the substrate 1, and electrodes 6 for applying a direct current electric field to the semiconductor 3' are provided on both sides of the semiconductor 3'. In the amplifier of this type, surface flatness of the semiconductors and the piezoelectric substrate and the size of the gap 8 have a great effect on the amplification gain. In order to obtain a practically acceptable amplification gain, the gap 8 must be made as small as possible and maintained constant over an operation range and so that industrial fabrication of the amplifiers with such a gap is very difficult. As shown in FIG. 5, the monolithic type amplifier is an amplifier having the structure in which a semiconductor 3' is formed on a piezoelectric substrate 1 via a dielectric film 9 without a gap. Input and output electrodes 4 and 5 are provided on the piezoelectric substrate 1, and electrodes 6 for applying a direct current electric field to the semiconductor layer 3' are provided on both sides of the semiconductor layer 3'. The monolithic type amplifier can achieve a high gain and be used in a high frequency region. Moreover, the monolithic type amplifier is said to be suitable for mass production. However, application of these surface acoustic wave amplifiers to a mobile communication apparatus such as a portable telephone has not been studied yet.

In order to realize a monolithic type amplifier, a semiconductor film of good electric characteristics must be formed on a piezoelectric substrate and the semiconductor film must be sufficiently thin so that there can occur efficient interaction between the surface acoustic wave and the carriers in the semiconductor. According to the study by Yamanouchi et al. of Tohoku University in 1970s (Yamanouchi K., et, al., Proceedings of the IEEE, 75, p726 (1975)), an electron mobility of InSb of 1,600 $cm^2$/Vsec was achieved using the structure in which SiO is coated on a LiNbO3 substrate to a thickness of 30 nm and then InSb thin film is evaporation-deposited on the substrate to a thickness of 50 nm. When a DC voltage of 1,100 V was applied to a surface acoustic wave amplifier having the semiconductor films, an amplification gain of net gain 40 dB was obtained at a center frequency of 195 MHz. Furthermore, based on their theoretical calculation, Yamanouchi et al. predicted that in an InSb thin film of 50 nm thick, the maximum electron mobility is 3,000 $cm^2$/Vsec because of surface scattering of carriers (Yamanouchi et al., Shingaku Gihou, US78-17. CPM78-26, pl9 (1978)). That is, the monolithic type amplifier faces the trouble that a thin film semiconductor layer having good electric characteristics is difficult to be formed on a piezoelectric substrate. Moreover, a conventional structure requires a dielectric film such as SiO in order to prevent deterioration of InSb and a $LiNbO_3$ substrate because of diffusion of oxygen from the $LiNbO_3$ substrate. Moreover, when a surface acoustic wave amplifier is used as an amplifier of a high frequency portion of a portable apparatus and a bandpass filter, the surface acoustic wave amplifier is useless if it gives no amplifying effect at a driving voltage of 3 to 6 V. A conventional monolithic amplifier needs a high voltage and there was no surface acoustic wave amplifier that could be driven at low voltages. Furthermore, there is the problem that a surface acoustic wave convolver, which makes use of interaction between a surface acoustic wave and electrons like the surface acoustic wave amplifier, gives an insufficient gain.

In general, an amplification gain, G, of a surface acoustic wave amplifier is given by the following equation:

$$G = Ak^2 \frac{\varepsilon p}{\sigma h}(\mu E - v)$$

where A=a constant, $k^2$=an electromechanical coupling coefficient, $\epsilon p$=an equivalent dielectric constant of a piezoelectric substrate, $\sigma$=a conductivity, h=a film thickness of an active layer, $\mu$=an electron mobility, E=an applied electric field, and v=a velocity of a surface acoustic wave. In order to obtain a large amplification gain at a low voltage of a practical level, it is necessary that; (1) a semiconductor thin film is formed which has a high electron mobility and whose film thickness is as thin as possible; and that (2) a piezoelectric substrate is used whose $k^2$ is as large as possible.

The present inventors have made intensive investigation on the above problems and as a result found that an active layer which is a thin film and has good electric characteristics can be obtained by inserting a buffer layer between the piezoelectric substrate and the active layer. The present inventors also found that an electromechanical coupling coefficient $k^2$ of the piezoelectric substrate far larger than that of a bulk can be achieved by using a multilayer piezoelectric thin film substrate of at least three layers. Furthermore, the present inventors confirmed that a surface acoustic wave amplifier is fabricated using the semiconductor layer or the piezoelectric thin film substrate and that good amplification gains can be obtained at practical low voltages by this amplifier, thus accomplishing the present invention. In addition, an electron mobility of 5,000 $cm^2$/Vsec or more of the active layer has been achieved with the semiconductor film structure of the present invention. That is, the present invention provides a surface acoustic wave functional element comprising a piezoelectric substrate, input and output electrodes provided on the piezoelectric substrate, semiconductor layers provided between the input and output electrodes. The semiconductor layers include an active layer and a buffer layer lattice matched to the active layer. Here, by the term "active layer" is meant a layer which oscillates a surface acoustic wave which is being propagated with energy of carriers in the semiconductor.

In the present invention, the thin film active layer can have very good electric characteristics of an active layer because the crystallinity of the active layer can be improved by inserting a buffer layer between the piezoelectric substrate and the active layer. Moreover, the present inventors found that when the lattice constant of the crystal forming the active layer is made equal or similar to that of crystal forming the buffer layer, the crystallinity of the active layer can be further improved, and that the electric characteristics of the active layer can be markedly improved even when the active layer is in the form of a thin film. The present inventors also found that still better electric characteristics can be obtained by using a compound semiconductor containing Sb as the buffer layer of the present invention. The buffer layer of the present invention is characterized by high resistance and small attenuation of a surface acoustic wave therein. The buffer layer of the present invention has superior properties in that it prevents the active layer from being deteriorated by oxygen from the piezoelectric substrate even when no dielectric film such as Sio is provided on the piezoelectric substrate and that it grows at low temperatures so that it does not deteriorate the piezoelectric substrate.

The piezoelectric substrate of the present invention comprises a multilayer piezoelectric body having at least three thin film layers, the layers having at least two different electromechanical coupling coefficients. Among the layers of the multilayer piezoelectric body, a central layer thereof has the largest electromechanical coupling coefficient. This facilitates efficient concentration of energy of the surface acoustic wave on a surface, so that the electromechanical coupling coefficient is made to be far larger than that of each piezoelectric body constituting each layer.

With the surface acoustic wave amplifier using the semiconductor layer of the present invention, the amplifying effect can be achieved at practical low voltages at which a portable appliance or device is used. Moreover, a far larger amplification gain can be achieved using the multilayer piezoelectric body of the present invention.

Furthermore, with respect to the surface acoustic wave convolver, the interaction between the surface acoustic wave convoluted and electrons is strengthened because of a high electron mobility of the semiconductor layers, resulting in a gain larger than that of a conventional structure.

Furthermore, when the surface acoustic wave functional element of the present invention, which has a large amplification gain at practical low voltages, is used as a device for (i) a bandpass filter and a low noise amplifier, (ii) a bandpass filter and a power amplifier, or (iii) a bandpass filter, amplifiers, and a duplexer, in a mobile communication apparatus, the mobile communication apparatus can be markedly down-sized, thinned and lightened in weight. Therefore, the transmitting/receiving circuit of a mobile communication apparatus such as a portable telephone or a cordless telephone falls within the range of the present invention where the surface acoustic wave functional element having the high amplification gain is formed as an amplifier and a bandpass filter, or an amplifier, a bandpass filter, and a duplexer.

The present invention will be described in detail below. FIGS. 1A and 1B illustrate is shows a basic surface acoustic wave functional element of the present invention. FIG. 1A is a cross sectional view showing a surface acoustic wave functional element of the present invention, and FIG. 1B is a perspective view showing the surface acoustic wave functional element of the present invention. Reference numerals 1, 2, 3, 4 and 5 designate a piezoelectric substrate, a buffer layer, an active layer, an input electrode and an output electrode, respectively.

According to the present invention, on the piezoelectric substrate 1 are arranged the input and output electrodes 4 and 5 at a distance from each other between which the active layer 3 is formed on the piezoelectric substrate 1 via the buffer layer 2.

In the present invention, the piezoelectric substrate 1 may be a piezoelectric single crystal substrate, or a piezoelectric thin film substrate. For the piezoelectric single crystal substrate, an oxide-based piezoelectric substrate is preferable. For example, $LiNbO_3$, $LiTaO_3$, or $Li_2B_4O_7$ is preferably used. Moreover, a substrate cut surface of $LiNbO_3$ of 64° Y cut, 41° Y cut, or 128° Y cut, or Y cut, or $LiTaO_3$ of 36° Y cut can be used preferably. The piezoelectric thin film substrate has the structure in which a piezoelectric thin film is formed on a single crystal substrate of sapphire or Si, etc. Preferred thin film materials for the piezoelectric thin film include, for example, ZnO, $LiNbO_3$, $LiTaO_3$, PZT, $PbTiO_3$, $BaTiO_3$ or $Li_2B_4O_7$. Furthermore, a dielectric film such as SiO, $SiO_2$, etc. can be inserted between a Si substrate and the above piezoelectric thin film. As the piezoelectric thin film substrate, a multilayer film can be formed which is fabricated by growing the above piezoelectric thin films of different types one above the other on the single crystal substrate of sapphire, Si, etc.

When the piezoelectric substrate 1 of the present invention comprises a multilayer piezoelectric element of at least three layers having at least two different electromechanical coupling coefficient and in which a piezoelectric film located in a central portion of the multilayer piezoelectric body has the largest electromechanical coupling coefficients, large electromechanical coupling coefficients can be obtained.

With respect to the multilayer piezoelectric substrate, an example of the three-layer structure will be described in detail below referring to FIG. 2. The multilayer piezoelectric substrate 20 of the present invention has the structure in which there are provided on a piezoelectric substrate 21 a first piezoelectric film 22 and a second piezoelectric film 23. Here, the electromechanical coupling coefficients of the piezoelectric substrate 21, the first piezoelectric film 22 and the second piezoelectric film 23 are assumed to be k, $k_1$, and $k_2$, respectively, and the velocities of Rayleigh waves of the piezoelectric substrate 21, the first piezoelectric film 22 and the second piezoelectric film 23 are assumed to be V, $V_1$ and $V_2$, respectively. The film thicknesses of the first and second piezoelectric films 22 and 23 are assumed to be $h_1$ and $h_2$, respectively. Then, it is necessary that $k_1$ is larger than k and $k_2$, and preferably $k_1$ is larger than k and $k_2$ by a factor of 1.2 or more, more preferably by a factor of 2 or more. Moreover, when $k_1$ is greater than k and $k_2$ and $V_1$ is greater than V and $V_2$, a far larger electromechanical coupling coefficient can be obtained. $V_1$ is preferably larger than V and $V_2$ by 100 m/s, and more preferably by 250 m/s. Moreover, $h_1$ is normally equal to or more than 30 nm and equal to or less than 20 μm, and more preferably equal to or more than 80 nm and equal to or less than 5 μm, far more preferably equal to or more than 100 nm and equal to or less than 2 μm. In general, $h_1/h_2$ is equal to or more than 0.1 and equal to or less than 500, preferably equal to or more than 0.15 and equal to or less than 50, and more preferably equal to or more than 0.5 and equal to or less than 21. When the wavelength of the surface acoustic wave is λ, $h_1/\lambda$ is 1 or less and $h_2/\lambda$ is 1 or less, preferably $h_1/\lambda$ is 0.5 or less and $h_2/\lambda$ is 0.4 or less, more preferably $h_1/\lambda$ is 0.25 or less and $h_2/\lambda$ is 0.25 or less.

The multilayer piezoelectric substrate 20 of a large electromechanical coupling coefficient of the present invention is preferably used in order to improve characteristics of a surface acoustic wave element of not only a surface acoustic wave amplifier and an acoustic surface convolver but also a surface acoustic wave filter, a surface acoustic wave resonator, etc.

As the active layer which constitutes the semiconductor layer of the present invention, one having a large electron mobility is preferably used. Preferred examples of the semiconductor film which constitutes the active layer include GaAs, InSb, InAs, and PbTe. Not only binary compound semiconductors but also ternary and quaternary mixed crystals derived from a combination of these binary semiconductors are preferably used. For example, ternary mixed crystals are $In_xGa_{1-x}As$, $InAs_ySb_{1-y}$, $In_zGa_{1-z}Sb$ and quaternary mixed crystals are $In_xGa_{1-x}As_ySb_{1-x}$ etc. In-containing semiconductor thin films such as those made of InAs, InSb, InAsSb, InGaSb, InGaAsSb, etc. are used preferably since they have very large electron mobilities. Moreover, the active layer may be a multilayer film formed by stacking semiconductor films of different compositions. The electron mobility of the active layer is preferably 5,000 $cm^2$/Vsec or more so as to have a large amplification gain of the surface acoustic wave amplifier, and more preferably, 10,000 $cm^2$/Vsec or more so as to have a very good amplification gain. In order to obtain this large electron mobility, the active layer has a composition $In_xGa_{1-x}As$ where "x" can range $0 \leq x \leq 1.0$, preferably $0.5 \leq x \leq 1.0$, and more preferably, $0.8 \leq x \leq 1.0$. The large electron mobility can be obtained when "y" of $InAs_ySb_{1-x}$ ranges $0 \leq y \leq 1.0$, and more preferably $0.5 \leq y \leq 1.0$. "z" of $In_zGa_{1-z}Sb$ preferably ranges $0 \leq z \leq 1.0$, and more preferably, $0.8 \leq z \leq 1.0$.

Moreover, when a film thickness, h, of the active layer is 5 nm or less, its crystal characteristics is deteriorated and large electron mobility cannot be obtained. On the other hand, when h is 500 nm or more, the resistance of the active layer is lowered and at the same time the interaction efficiency of a surface acoustic wave and carriers is decreased. That is, in order to achieve large electron mobility and to perform the interaction of a surface acoustic wave and carriers efficiently, it is necessary that film thickness, h, of the active layer ranges 5 m $\leq h \leq$ 500 nm, preferably 10 nm $\leq h \leq$ 350 nm, and more preferably 12 nm $\leq h \leq$ 200 nm. Moreover, a sheet resistance value of the active layer is preferably 10 Ω or more, more preferably 50 Ω or more, and most preferably 100 Ω or more.

It is preferable that the buffer layer formed on the piezoelectric substrate of the present invention be insulated or semi-insulated. However, the large resistance value is available. For example, the resistance value of the buffer layer is at least 5 to 10 or more times as large as that of the active layer, preferably 100 times or more and more preferably 1000 times or more are preferable examples.

As the large resistance buffer layer, for example, a binary crystal such as GaSb, AlSb, ZnTe, or CdTe is preferably used. Ternary crystals such as AlGaSb, AlAsSb, GaAsSb, and AlInSb are used preferably. Quaternary crystals such as AlGaAsSb, AlInGaSb, AlInAsSb, AlInPSb, and AIGaPSb are used preferably. Moreover, when the composition of the buffer layer is determined, the lattice constant of the buffer layer is adjusted such that it has the same as or similar to the lattice constant of the crystal constituting the active layer. Thus, large electron mobility of the active layer can be achieved. Here, when the difference of the lattice constant of the crystals of the active layer and that of the buffer layer is ±7% or less, preferably ±5% or less and more preferably ±2% or less, the both lattice constants are similar to each other.

Further, during the actual step of forming the buffer layer 2 on the piezoelectric substrate 1, the lattice relaxation takes place extremely rapidly, particularly, in a buffer layer containing Sb. Even if its lattice mismatch with the piezoelectric substrate 1 is great, the lattice disorder is relaxed merely by growing an ultra-thin film of the buffer layer, and the buffer layer 2 begins to grow at a unique lattice constant specific to the crystal which constitutes the buffer layer 2. Immediately before the growth of the active layer, the buffer layer surface is in extremely satisfactory conditions, thereby greatly improving the crystallinity of the active layer 3 formed on the buffer layer 2. For this reason, an Sb-containing compound semiconductor is especially suitable for use as the buffer layer 2.

The thicker the buffer layer 2, the better its crystallinity. However, it is preferred the buffer layer 2 is as thin as possible from the standpoint of facilitation of the interaction between the surface acoustic wave and the carrier. More specifically, a preferred film thickness $h_3$ of the buffer layer is 10 nm $\leq h_3 \leq$ 1,000 nm, and preferably, 20 nm $\leq h_3 \leq$ 500 nm.

Further, since the buffer layer 2 can grow at low temperatures, it is possible not only to prevent the piezoelectric substrate 1 from deteriorating due to leakage of oxygen, but also to prevent the active layer 3 formed on the buffer layer 2 from deteriorating due to migration of oxygen from the piezoelectric substrate 1. Further, the buffer layer 2 of the present invention is remarkably featured in that it serves as a protective layer for protecting the piezoelectric substrate 1 and the active layer 3, thus eliminating the need for the provision of a protective layer in the form of a dielectric film composed of SiO or $SiO_2$.

Instead, no problem arises even if a dielectric film is present between the piezoelectric substrate 1 and the buffer layer 2. Examples of materials used for the dielectric film are SiO, $SiO_2$, silicon nitride, $CeO_2$, $CaF_2$, $BaF_2$, $SrF_2$, $TiO_2$, $Y_2O_3$, $ZrO_2$, MgO, and $Al_2O_3$. The dielectric film is as thin as possible. Preferably, the thickness of the dielectric film is 100 nm or less, and more preferably, 50 nm or less.

The buffer layer 2 of the present invention, as compared with a dielectric film 9 such as SiO inserted between the piezoelectric substrate 1 and the active layer 3' of a conventional monolithic type amplifier, is lattice-matched to the active layer and has a large dielectric constant unexpected for semiconductors and a high resistivity. Accordingly, the electric field of the surface acoustic wave attenuates much less in the buffer layer 2 of the present invention. Therefore, the interaction between the electric field of the surface acoustic wave and the carriers in the active layer 3 occurs more efficiently than conventionally so that the buffer layer 2 of the present invention can be made thicker than the conventional dielectric film 9.

Further, a dielectric film or a semiconductor film may be grown on the active layer 3 as a protective layer in order to protect the active layer 3. As the dielectric film, the compositions indicated above may be used. As the semiconductor film, the same composition as that of the buffer layer may be used.

Generally, any method may be employed for forming films such as the buffer layer 2 and the active layer 3 as far as it allows growth of a thin film. It is especially preferred to employ a molecular beam epitaxy (MBE) method, a metal organic molecular beam epitaxy (MOMBE) method, a metal organic chemical vapor depposition (MOCVD) method, and an atomic layer epitaxy (ALE) method.

Further, in the present invention, the input and output electrodes 4 and 5 on the piezoelectric substrate 1 are electrodes having an interdigital structure. For such electrodes, an apodised transducer, a withdrawal weighted transducer, a unidirectional transducer, a normal type transducer and the like can be used. Particularly, the unidirectional transducer can reduce a loss due to bi-directional property of the surface acoustic wave. Consequently, the unidirectional transducer is used most preferably. Though materials for an input electrode 4 and an output electrode 5 are not particularly limited, it is preferred to use Al, Au, Pt, Cu, an Al—Ti alloy, an Al—Cu alloy, an Al and Ti multilayer electrode, for example.

In the case where the buffer layer 2 is formed such that the input and output electrodes 4 and 5 are embedded, the input and output electrodes 4 and 5 are formed in the first step. Thus eliminating the need to consider a recess and a projection of the semiconductor thin film allows the ultra-fine processing of the electrodes of the order of submicrons or less by the contact exposure.

However, since the input and output electrodes 4 and 5 are embedded in the buffer layer 2, it is necessary to select electrode materials which deform, melt, or diffuse in the least degree during the process of the formation of the buffer layer. Preferred examples of the electrode materials include Pt, Au, Cu, Al, Cr, Mo, Ni, Ta, Ti, W, and the like. Further, it is also preferred to use a multi-layered electrode of Ti—Pt, Ti—Al, Ti—Au, Cr—Au, Cr—Pt, etc.

There is no specific limitation to materials used as electrodes 6 for applying the DC electric field to the semiconductor layer in the surface acoustic wave amplifier of the present invention. Preferred examples of the electrode materials include Al, Au, Ni/Au, Ti/Au, Cu/Ni/Au, AuGe/Ni/Au, and the like.

When the surface acoustic wave functional element is used for a portion of a power amplifier which is required to have the capability of high power withstanding property, input and output electrodes 4 and 5 must use electrode materials which can withstand large power, i.e. power of an order of several Watts. Examples of preferred high power resistant materials for such electrodes capable of withstanding large power include an epitaxial Al film, an Al—Cu film, and Al—Cu/Cu/Al—Cu multi-layered film, a Ti-added-Al film, a Cu-added-Al film, a Pd-added-Al film.

The surface acoustic wave amplifier of the present invention may have the structure in which at least two separate semiconductor layers are successively formed on the substrate side by side between the input and output electrodes 4 and 5, and in addition, there is provided the arrangement which removes carriers moving in the direction opposite to the propagation direction of a surface acoustic wave or an arrangement in which the active layer 3 between the semiconductor layers is removed. With such a structure, the present invention can attain a high amplification gain at low voltages. For example, as shown in FIG. 6, semiconductor layers are separated by a mesa etching technique, or after the mesa etching process, a dielectric substance (not shown) is filled between the semiconductor layers so that the carriers moving in the opposite direction due to a reverse electric field can be removed.

In the surface acoustic wave convolver of the present invention, the electrodes formed on the piezoelectric substrate are used as two input electrodes. Further, the signal after convolution of the surface acoustic wave is taken out from take-out electrodes formed on an upper portion of the semiconductor layer and on a lower portion of the piezoelectric substrate, respectively. Materials for the take-out electrodes are not limited specifically. Preferably, Al, Au, Pt, Cu, and the like are used as take-out electrode materials.

In a conventional portable telephone set schematically shown in FIG. 7, to an antenna 10 is connected a duplexer 11, which is connected to a receiving amplifier 12 and a transmitting amplifier 13, each of the receiving and transmitting amplifiers 12 and 13 connected to a band pass filter 14. In contrast, as shown in FIG. 8, when the surface acoustic wave functional element capable of amplifying at a high amplification gain according to the present invention is applied to an RF portion, only a surface acoustic wave amplifier 15 for receiving and a surface acoustic wave amplifier 16 for transmitting are connected to the antenna 10. Therefore, according to the present invention, the number of component parts of the RF portion can be reduced as shown in FIG. 8, and each of the component parts can be made compact, lightweight and thin. Namely, the present invention can provide compact, lightweight terminals of portable appliances at low costs.

BEST MODE FOR CARRYING OUT THE INVENTION

Figure 1A:
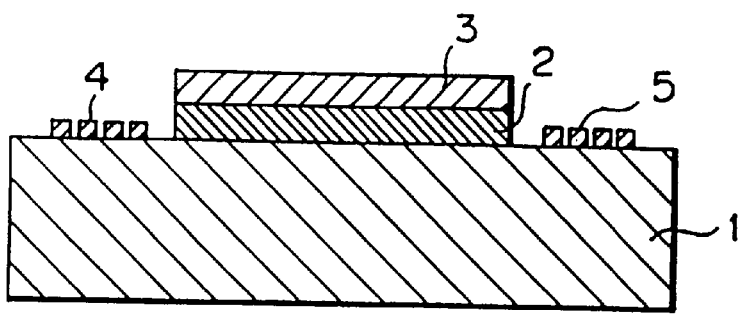
FIG. 1A is a cross sectional view showing a surface acoustic wave functional element in accordance with an embodiment of the present invention.
Figure 1B:
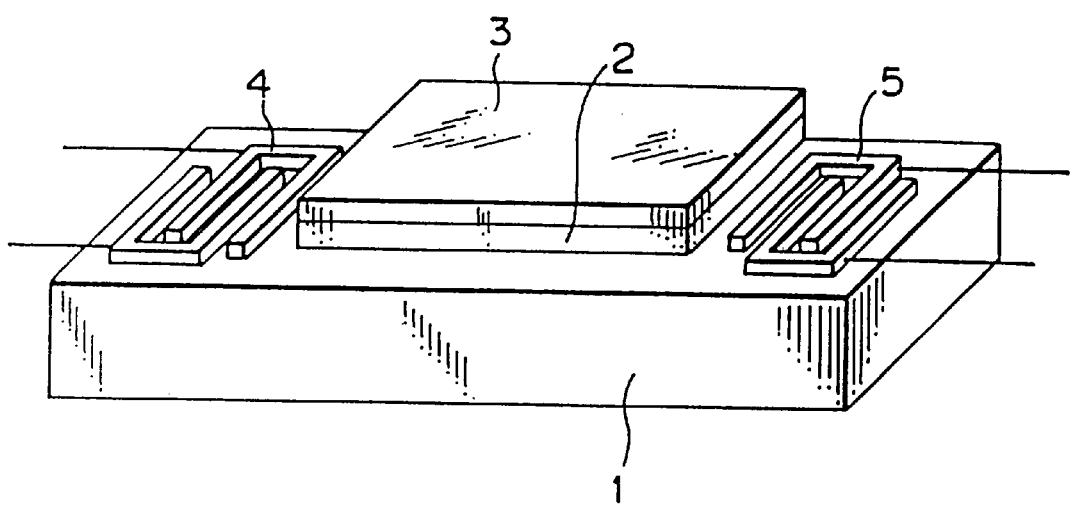
FIG. 1B is a perspective view showing a surface acoustic wave functional element in accordance with an embodiment of the present invention.
Figure 2:
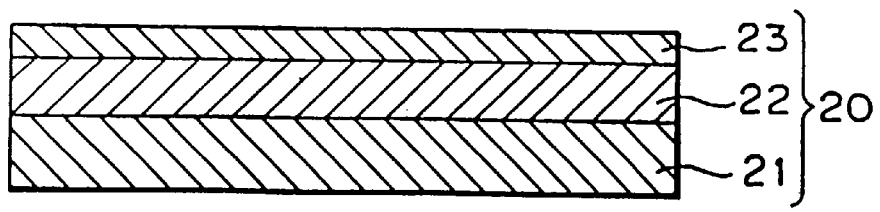
FIG. 2 is a cross sectional view showing a multilayer piezoelectric substrate of the present invention.
Figure 3:
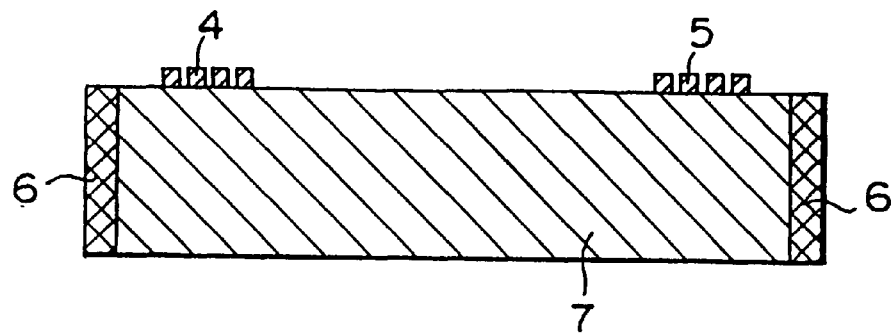
FIG. 3 is a cross sectional view showing a conventional direct type amplifier.
Figure 4:
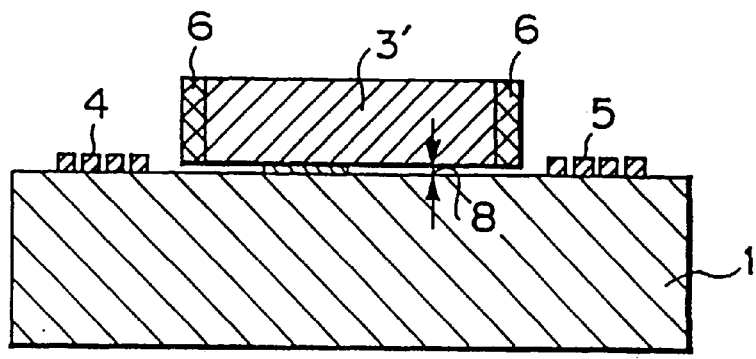
FIG. 4 is a cross sectional view showing a conventional separate type amplifier.
Figure 5:
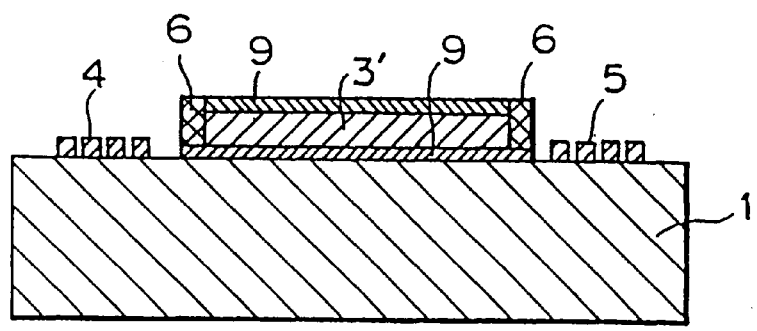
FIG. 5 is a cross sectional view showing a conventional monolithic amplifier.

Now, the present invention will be described below with referring to specific embodiments.

Embodiment 1

After $SiO_2$ of 10 nm thick was deposited by evaporation on a $LiNbO_3$ single crystal substrate of 64 degree Y-cut, with a diameter of 3 inches, $Al_{0.38}In_{0.62}Sb$ was grown by the MBE method to 150 nm as buffer layer. Thereafter, InSb was grown to 50 nm as an active layer. Subsequently, GaSb was grown to 2 nm as a protective layer, thus forming a semiconductor layer. This semiconductor layer had an electron mobility of 32,000 $cm^2$/Vs. Here, the electron mobility of the semiconductor layer was measured by the Van der Pauw method.

Next, the semiconductor layer at a predetermined position was removed by an etching process to expose a portion of the piezoelectric substrate. Interdigital Al electrodes were formed on the surface of the piezoelectric substrate by a lithographic process as input/output electrodes. The electrodes are of a normal type having a pitch of 0.75 $\mu$m, with a propagation length of 300 $\mu$m. Subsequently, electrodes for applying a DC electric field were formed on the active layer. It is preferred that the propagation length of a surface acoustic wave is set up to a value obtained by multiplying the length of the surface acoustic wave with a positive integer.

Next, the characteristics of the surface acoustic wave amplifier were measured. Its amplification gain was evaluated by finding a difference between a gain (or an insertion loss) after application of the electric field and an insertion loss before application of the electric field using a network analyzer (Yokokawa Hewlett Packard, 8510B). As a result of the evaluation of the surface acoustic wave amplifier in accordance with Embodiment 1 of the present invention, the amplification gain was 22 dB where a DC applying voltage was 3 V, and a central frequency was 1,520 MHz. This value of the amplification gain is suitable for use in a low-noise amplifier and a bandpass filter in a high frequency portion of portable appliances.

Embodiment 2

The same sample as that of Embodiment 1 was etched to remove a predetermined portion of the semiconductor and expose a portion of the piezoelectric substrate. Interdigital Al electrodes were formed as input and output electrodes by lithography. The electrodes were of a normal type electrode having a pitch of 1.4 $\mu$m, with a propagation length of 280 $\mu$m. Subsequently, electrodes for applying a DC electric field were formed on the active layer.

Next, the characteristics of the surface acoustic wave amplifier were measured. Its amplification gain was evaluated in the same manner as in Embodiment 1. As a result of the evaluation of the surface acoustic wave amplifier of Embodiment 2 of the present invention, the amplification gain was 12 dB where a DC applying voltage was 3 V, and a central frequency was 800 MHz. This value of the amplification gain is suitable for use in a low-noise amplifier and a bandpass filter in a high frequency portion of portable appliances.

Comparative Embodiment 1

As a comparison with Embodiment 2, Comparative Embodiment 1 was run. After $SiO_2$ of 10 nm was deposited by evaporation on a $LiNbO_3$ single crystal substrate of 64 degree Y-cut, with a diameter of 3 inches, InSb was grown to 50 nm by a MBE method as an active layer. Thereafter, GaSb was grown to 2 nm as a protective layer, thus forming a semiconductor layer. The electric characteristics of the semiconductor layer were measured. However, in this Comparative Embodiment, InSb as the active layer was directly formed on the piezoelectric substrate via the $SiO_2$ film. Consequently, the crystal property of the active layer was insufficient, and its electron mobility was only 1,700 $cm^2$/Vs.

Thereafter, the semiconductor layer at a predetermined position was etched to expose the piezoelectric substrate. Interdigital Al electrodes were formed on the surface of the piezoelectric substrate by a lithographic process as input and output electrodes, respectively. The electrodes were of a normal type having a pitch of 1.4 $\mu$m, with a propagation length of 280 $\mu$m. Subsequently, electrodes for applying a DC electric field were formed on the active layer. Thereafter, the surface acoustic wave amplifying characteristics were measured similarly as in Embodiment 2, but no amplifying effect was observed.

Embodiment 3

After $SiO_2$ of 10 nm was deposited by evaporation on a $LiNbO_3$ single crystal substrate of 64 degree Y-cut, with a diameter of 3 inches, $Al_{0.5}Ga_{0.5}Sb$ was grown to 200 nm by a MBE method as a buffer layer. Thereafter, $InAs_{0.5}Sb_{0.5}$ was grown to 60 nm as an active layer. Subsequently, GaSb was grown to 2 nm as a protective layer, thus forming a semiconductor layer. This semiconductor layer had an electron mobility of 30,000 $cm^2$/Vs.

Next, the semiconductor layer at predetermined portion was etched to expose the piezoelectric substrate. Interdigital Al electrodes were formed on the surface of the piezoelectric substrate by a lithographic process as input and output electrodes, respectively. The electrodes were of a normal type having a pitch of 0.6 $\mu$m, with a propagation length of 240 $\mu$m. Subsequently, electrodes for applying a DC electric field were formed on the active layer.

Next, the characteristics of a surface acoustic wave amplifier were measured. Its amplification gain was evaluated by the same method as in Embodiment 1. As a result of the evaluation of the surface acoustic wave amplifier of Embodiment 3 of the present invention, the amplification gain was 26 dB where a DC applying voltage was 3 V, and a central frequency was 1,900 MHz. This value of the amplification gain is suitable for use in a low-noise amplifier and a bandpass filter in a high frequency portion of portable appliances.

Embodiment 4

After $SiO_2$ of 10 nm was deposited by evaporation on a $LiNbO_3$ single crystal substrate of 64 degree Y-cut, with a diameter of 3 inches, $Al_{0.5}G_{0.5}Sb$ was grown to 150 nm by a MBE method as buffer layer. Thereafter, InAs$_{0.5}$Sb$_{0.5}$ was grown to 50 nm as an active layer. Subsequently, GaSb was grown to 2 nm as a protective layer, thus, forming a semiconductor layer. This semiconductor layer had an electron mobility of 20,900 cm$^2$/Vs.

Next, the semiconductor layer at a predetermined position was etched to expose the piezoelectric substrate. Interdigital Al electrodes were formed on the surface of the piezoelectric substrate by a lithographic process as input and output electrodes. respectively. The electrodes are of a normal type having a pitch of 0.75 μm, with a propagation length of 300 μm. Subsequently, electrodes for applying a DC electric field were formed on the active layer.

Next, the characteristics of a surface acoustic wave amplifier were measured. Its amplification gain was evaluated by the same method as in Embodiment 1. As a result of the evaluation of the surface acoustic wave amplifier of Embodiment 4 of the present invention, the amplification gain was 13 dB where a DC applying voltage was 3 V, and a central frequency was 1,530 MHz. This value of the amplification gain is suitable for use in a low-noise amplifier and a bandpass filter in a high frequency portion of portable appliances

Embodiment 5

After SiO$_2$ of 10 nm was deposited by evaporation on a LiNbO$_3$ single crystal substrate of 64 degree Y-cut, with a diameter of 3 inches, Al$_{0.5}$Ga$_{0.5}$Sb was grown to 100 nm by a MBE method as a buffer layer. Thereafter, InAs$_{0.5}$Sb$_{0.5}$ was grown to 200 nm as an active layer. Subsequently, GaSb was grown to 2 nm as a protective layer, thus forming a semiconductor layer. This semiconductor layer had an electron mobility of 32,000 cm$^2$/Vs.

Next, the semiconductor layer at a predetermined position was etched to expose a piezoelectric substrate. Interdigital Al electrodes were formed on the surface of the piezoelectric substrate by a lithographic process as input and output electrodes, respectively. The electrodes were of a normal type having a pitch of 0.75 μm, with a propagation length of 300 μm. Subsequently, electrodes for applying a DC electric field were formed on the active layer.

Next, the characteristics of the surface acoustic wave amplifier were measured. Its amplification gain was evaluated by the same method as in Embodiment 1. As a result of the evaluation of the surface acoustic wave amplifier of Embodiment 5 of the present invention, the amplification gain was 6 dB where a DC applying voltage was 6 V, and a central frequency was 1,505 MHz. Consequently, the amplifying effect was obtained at a voltage as low as 6 V.

Comparative Embodiment 2

As a comparison with Embodiment 4, Comparative Embodiment 2 was run. After SiO$_2$ of 10 nm was deposited by evaporation on a LiNbO$_3$ single crystal substrate of 64 degree Y-cut, with a diameter of 3 inches, InAs$_{0.5}$Sb$_{0.5}$ was grown to 50 nm by a MBE method as an active layer. Thereafter, GaSb was grown to 2 nm as protective layer, thus forming a semiconductor layer. The electric characteristics of this semiconductor layer were measured. However, in this Comparative Embodiment, InAs$_{0.5}$Sb$_{0.5}$ as the active layer was directly formed on the piezoelectric substrate via the SiO$_2$ film. Consequently, the crystallinity of the active layer was inadequate, and its electron mobility was only 1,200 cm$^2$/Vs.

Thereafter, the semiconductor layer at a predetermined position was etched to expose the piezoelectric substrate. Interdigital Al electrodes were formed on the surface of the piezoelectric substrate by a lithographic process as input and output electrodes, respectively. The electrodes were of a normal type having a pitch of 0.75 μm, with a propagation length of 300 μm. Subsequently, electrodes for applying a DC electric field were formed on the active layer. Thereafter, the surface acoustic wave amplifying characteristics were measured, but no amplifying effect was observed.

Embodiment 6

After SiO$_2$ of 10 nm was deposited by evaporation on a LiNbO$_3$ single crystal substrate of 64 degree Y-cut, with a diameter of 3 inches, Al$_{0.5}$Ga$_{0.5}$Sb was grown to 150 nm by a MBE method as a buffer layer. Thereafter, InAs was grown to 350 nm as an active layer. Subsequently, GaSb was grown to 2 nm as a protective layer, thus forming a semiconductor layer. This semiconductor layer had an electron mobility of 22,000 cm$^2$/Vs.

Next, the semiconductor layer at a predetermined position was etched to expose a piezoelectric substrate. Interdigital Al electrodes were formed on the surface of the piezoelectric substrate by a lithographic process as input and output electrodes, respectively. The electrodes were of a normal type having a pitch of 0.6 μm, with a propagation length of 240 μm. Subsequently, electrodes for applying a DC electric field were formed on the active layer.

Next, the characteristics of the surface acoustic wave amplifier were measured. Its amplification gain was evaluated by the same method as in Embodiment 1. As a result of the evaluation of the surface acoustic wave amplifier of Embodiment 6, the amplification gain was 2 dB where a DC applying voltage was 6 V, and a central frequency was 1,500 MHz. Consequently, the amplifying effect was obtained at a voltage as low as 6 V.

Embodiment 7

After SiO$_2$ of 10 nm was deposited by evaporation on a LiNbO$_3$ single crystal substrate of 64 degree Y-cut, with a diameter of 3 inches, Al$_{0.5}$Ga$_{0.5}$As$_{0.12}$Sb$_{0.88}$ was grown to 150 nm by a MBE method as a buffer layer. Thereafter, InAs was grown to 50 nm as an active layer, Subsequently, GaSb was grown to 2 nm as a protective layer, thus forming a semiconductor layer. This semiconductor layer has an electron mobility of 13,000 cm$^2$/Vs.

Next, the semiconductor layer at a predetermined position was etched to expose a piezoelectric substrate. Interdigital Al electrodes were formed on the surface of the piezoelectric substrate by a lithographic process as input and output electrode, respectively. The electrodes were of a normal type having a pitch of 1.4 μm, with a propagation length of 560 μm. Subsequently, electrodes for applying a DC electric field were formed on the active layer.

Next, the characteristics of the surface acoustic wave amplifier were measured. Its amplification gain was evaluated by the same method as in Embodiment 1. As a result of the evaluation of the surface acoustic wave amplifier of Embodiment 7, the amplification gain was 6 dB where a DC applying voltage was 5 V, and a central frequency was 810 MHz. Consequently, the amplifying effect was obtained at a voltage as low as 5 V.

Embodiment 8

After SiO$_2$ of 10 nm was deposited by evaporation on a LiNbO$_3$ single crystal substrate of 64 degree Y-cut, with a diameter of 3 inches, Al$_{0.5}$Ga$_{0.5}$As$_{0.12}$Sb$_{0.88}$ was grown to 150 nm by a MBE method as a buffer layer. Thereafter, InAs was grown to 20 nm as an active layer. Subsequently, GaSb was grown to 2 nm as a protective layer, thus forming a semiconductor layer. This semiconductor layer had an electron mobility of 8000 cm$^2$/Vs.

Next, the semiconductor layer at a predetermined position was etched to expose a piezoelectric substrate. Interdigital Al electrodes were formed on the surface of the piezoelectric substrate by a lithographic process as input and output electrodes, respectively. The electrodes are of a normal type having a pitch of 1.4 μm, with a propagation length of 560 μm. Subsequently, electrodes for applying a DC electric field were formed on the active layer.

Next, the characteristics of the surface acoustic wave amplifier were measured. Its amplification gain was evaluated by the same method as in Embodiment 1. As a result of the evaluation of the surface acoustic wave amplifier of Embodiment 8, the amplification gain was 3 dB where a DC applying voltage was 6 V, and a central frequency was 835 MHz. Consequently, the amplifying effect was obtained at a voltage as low as 6 V.

Embodiment 9

After SiO$_2$ of 10 nm was deposited by evaporation on a LiNbO$_3$ single crystal substrate of 64 degree Y-cut, with a diameter of 3 inches, Al$_{0.5}$Ga$_{0.5}$As$_{0.12}$Sb$_{0.88}$ was grown to 150 nm by a MBE method as a buffer layer. Thereafter, InAs was grown to 10 nm as an active layer. Subsequently, GaSb was grown to 2 nm as a protective layer, thus forming a semiconductor layer. This semiconductor layer had an electron mobility of 5,000 cm$^2$/Vs.

Next, the semiconductor layer at a predetermined position was etched to expose a piezoelectric substrate. Interdigital Al electrodes were formed on the surface of the piezoelectric substrate by a lithographic process as input and output electrodes, respectively. The electrodes were of a normal type having a pitch of 0.75 μm, with a propagation length of 300 μm. Subsequently, electrodes for applying a DC electric field were formed on the active layer.

Next, the characteristics of the surface acoustic wave amplifier were measured. An amplification gain was evaluated by the same method as in Embodiment 1. As a result of the evaluation of the surface acoustic wave amplifier of Embodiment 9, the amplification gain was 4 dB where a DC applying voltage was 6 B, and a central frequency was 1,560 MHz. Consequently, the amplifying effect was obtained at a voltage as low as 6 V.

Comparative Embodiment 3

As a comparison with Embodiment 7, Comparative Embodiment 3 was run. After SiO$_2$ of 10 nm was deposited by evaporation on a LiNbO$_3$ single crystal substrate of 64 degree Y-cut, with a diameter of 3 inches, InAs was grown to 50 nm by a MBE method as an active layer. Thereafter, GaSb was grown to 2 nm as a protective layer, thus forming a semiconductor layer. The electric characteristics of this semiconductor layer were measured. However, in this Comparative Embodiment, InAs as the active layer was directly formed on the piezoelectric substrate via the SiO$_2$ film. Consequently, the crystallinity of the active layer was inadequate, and its electron mobility was only 900 cm$^2$/Vs. Thereafter, a semiconductor layer at a predetermined position was etched to expose the piezoelectric substrate. Interdigital Al electrodes were formed on the surface of the piezoelectric substrate by a lithographic process as input and output electrodes, respectively. The electrodes were of a normal type having a pitch of 1.4 μm, with a propagation length of 560 μm. Subsequently, electrodes for applying a DC electric field were formed on the active layer. Thereafter, surface acoustic wave amplifying characteristics were measured, but no amplifying effect was observed.

Embodiment 10

After Al$_{0.5}$Ga$_{0.5}$As$_{0.1}$Sb$_{0.9}$ as a buffer layer was grown to 50 nm on a LiNbO$_3$ single crystal substrate of 128 degree Y-cut, with a diameter of 3 inches by a MBE method, InSb was grown to 400 nm as an active layer, thus forming a semiconductor layer. This semiconductor layer had an electron mobility of 7,000 cm$^2$/Vs and a carrier concentration of $1 \times 10^{16}$ cm$^{-3}$.

Next, the surface acoustic wave amplifier was manufactured by the same method as in Embodiment 1. The electrodes were of a normal type having a pitch of 0.75 μm, with a propagation length of 300 μm.

As a result of measurement of the characteristics of the surface acoustic wave amplifier, an amplification gain was 3 dB where a DC applying voltage was 5 V, and a central frequency was 1,500 MHz. Consequently, the amplifying effect was obtained at a voltage as low as 5 V. Furthermore, the deterioration of the LiNbO$_3$ substrate or deterioration of the InSb active layer due to oxygen diffusion from the LiNbO$_3$ substrate was not observed even without any dielectric film of SiO. As a result, it was confirmed that the Al$_{0.5}$Ga$_{0.5}$As$_{0.1}$Sb$_{0.9}$ buffer layer functioned as a protective film for the semiconductor active layer and a piezoelectric substrate.

Comparative Embodiment 4

As a comparison with Embodiment 10, Comparative Embodiment 4 was run. InSb as an active layer was grown to 50 nm by a MBE method directly on a LiNbO$_3$ single crystal substrate of 64 degree Y-cut, with a diameter of 3 inches, thus forming a semiconductor layer. The electric characteristics of this semiconductor layer were measured. In this Comparative Embodiment, since InSb was grown directly on the LiNbO$_3$ substrate without forming a protective layer such as a dielectric film, the quality of the InSb film as the active layer was deteriorated due to oxygen leakage from LiNbO$_3$. Consequently, an electron mobility could not be measured.

Embodiment 11

Figure 9:
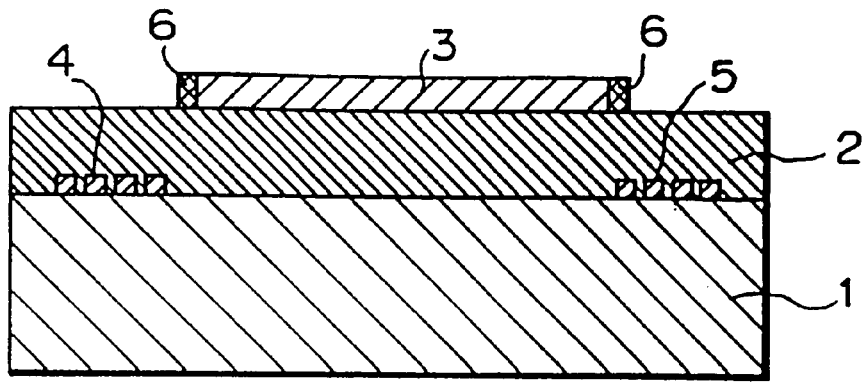
FIG. 9 is a cross sectional view showing a surface acoustic wave amplifier in which input and output electrodes are embedded in a buffer layer.

A surface acoustic wave amplifier having a cross sectional structure as shown in FIG. 9 was fabricated.

Interdigital Ti—Pt electrodes as input and output electrodes 4 and 5 were formed at a predetermined position on a LiNbO$_3$ single crystal substrate 1 of 128 degree Y-cut, with a diameter of 3 inches, by a lithographic process of normal contact exposure. The electrodes 4 and 5 were of a normal type having a pitch of 1.4 μm, with a propagation length of 364 μm. Subsequently, Al$_{0.38}$In$_{0.62}$Sb was grown to 150 nm by a MBE method as a buffer layer 2 in such a manner that the input and output interdigital electrodes 4 and 5 were embedded therewith on the substrate 1. Thereafter, InSb was grown to 50 nm as an active layer 3, thus forming a semiconductor layer. This semiconductor layer had an electron mobility of 34,000 cm$^2$/Vs.

Next, after the active layer 3 at a predetermined position was removed by an ion milling method, electrodes 6 for applying a DC electric field were formed on the active layer 3 (FIG. 9 shows a cross sectional view for the structure thereof). Thereafter, a silicon nitride film for passivation was deposited by evaporation, and then, windows were formed. The characteristics of the surface acoustic wave amplifier were measured. As a result, the amplification gain was as large as 17 dB where a DC applying voltage was 6 V, and a central frequency was 809 MHz.

Embodiment 12

Figure 10:
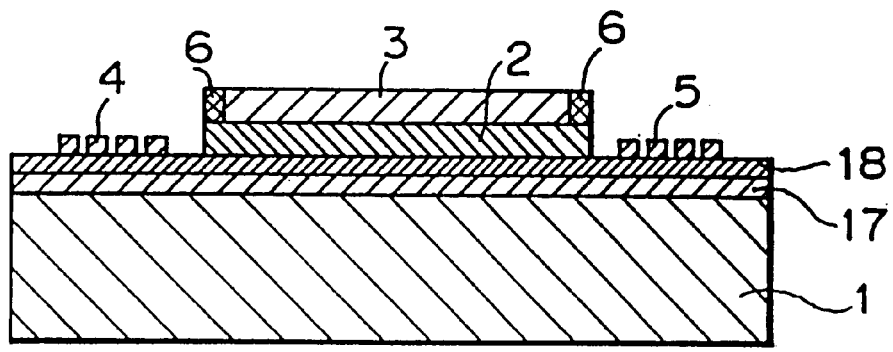
FIG. 10 is a cross sectional view showing a surface acoustic wave amplifier using a multilayer piezoelectric body in accordance with the present invention.

A surface acoustic wave amplifier having a cross sectional structure as shown in FIG. 10 was fabricated.

LiNbO$_3$ layer 17 having a thickness of 2.0 μm was grown on a LiTaO$_3$ single crystal substrate 1 of Y-cut by a laser ablation method, and further, a LiTaO$_3$ layer 18 having a thickness of 0.1 μm was grown on the LiNbO$_3$ layer 17, thus forming a multilayer piezoelectric substrate of a three-layer structure. As a result of an analysis of the grown thin film by Auger electron spectroscopy, it was confirmed that a LiNbO$_3$ film 17 and a LiTaO$_3$ film 18 without any disorder in stoichimetry was formed. Moreover, it was found by X-ray diffraction that a (110) LiNbO$_3$ layer 17 and a (110) LiTaO$_3$ layer 18 were heteroepitaxially grown in a twin or domain free state.

In order to measure the electromechanical coupling coefficient of the multilayer piezoelectric substrate, an Al comb-like electrode was formed by a common lithographic process in such a manner that the wavelength of a surface acoustic wave became 8 μm. The electromechanical coupling coefficient measured by a network analyzer was as large as 20.0%.

Additionally, the surface acoustic wave amplifier as depicted in FIG. 10 was manufactured by the use of the multilayer piezoelectric substrate in the same method as in Embodiment 10. As a result of measurement of the characteristics of the surface acoustic wave amplifier, the amplification gain was 12 dB where a DC applying voltage was 5 V and a central frequency was 1,500 MHz. It was confirmed that the multilayer piezoelectric substrate having a remarkably large electromechanical coupling coefficient in this Embodiment exhibited an excellent amplifying effect in the surface acoustic wave amplifier about four times more than was obtained in Embodiment 10.

Comparative Embodiment 5

As a comparison with Embodiment 12, Comparative Embodiment 5 was run. The electromechanical coupling coefficient of the multilayer piezoelectric substrate in Embodiment 12 was compared with the electromechanical coupling coefficients of materials constituting each layer and a two-layer piezoelectric substrate. The results obtained of electromechanical coupling coefficients of materials constituting each layer in the same method as Embodiment 12 were 4.7% in the single crystal (110) LiNbO$_3$ and 0.68% in the single crystal (110) LiTaO$_3$.

An electromechanical coupling coefficient was measured also in the case of constituting materials formed in a two-layer structure. Namely, a LiNbO$_3$ film was grown on a Y-cut LiTaO$_3$ substrate by the same laser ablation method as in Embodiment 12. The result of measurement of an electromechanical coupling coefficient was 3.0% in the two-layer structure of LiNbO$_3$/LiTaO$_3$, which was lower than the single crystal (110) LiNbO$_3$.

Consequently, it has been found that the electromechanical coupling coefficient of the multilayer piezoelectric substrate according to the present invention can be greatly increased in the case of the three-layer structure. The electromechanical coupling coefficient was increased about four times that obtained in Embodiment 12, thereby increasing the amplification gain of the surface acoustic wave amplifier.

Embodiment 13

By the same method as in Embodiment 10, a semiconductor layer was grown on a LiNbO$_3$ substrate of 128 degree Y-cut. Subsequently, the semiconductor layer at a predetermined position was etched to expose a piezoelectric substrate. Interdigital Al—Cu/Cu/Al—Cu multilayer electrodes as input and output high-withstand power electrodes were formed on the piezoelectric substrate by a lithographic process. The electrodes were of a normal type having a pitch of 0.75 μm, with a propagation length of 300 μm. Subsequently, electrodes for applying a DC electric field were formed on the active layer.

The characteristics of the surface acoustic wave amplifier were evaluated by sending an RF signal from a signal generator (Anritsu MG3670A) so as to measure an amplification gain and a transmission power by means of a power meter and a power sensor (Yokokawa Hewlett Packard, 437B and 8481H). The amplification gain was 22 dB and the transmission power was 2.2 W where a DC applying voltage was 3 V and a central frequency was 1,520 MHz. Consequently, the surface acoustic wave amplifier in this Embodiment can be used as an excellent power amplifier in a high frequency portion of mobile communication appliances or the like, and further, it can remarkably contribute to down-sizing of such appliances.

Embodiment 14

Figure 6:
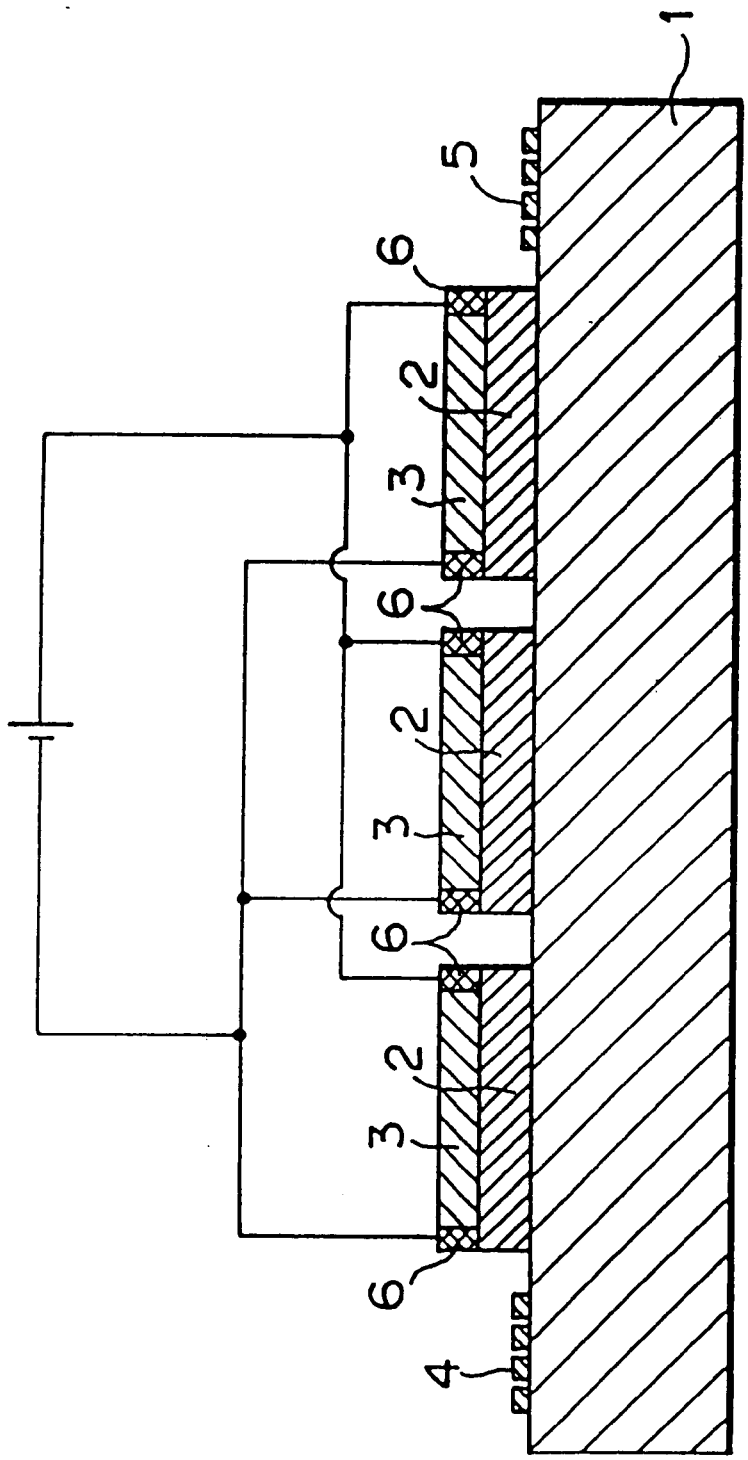
FIG. 6 is a cross sectional view showing a semiconductor layer-separated type surface acoustic wave amplifier in accordance with an embodiment of the present invention.
Figure 7:
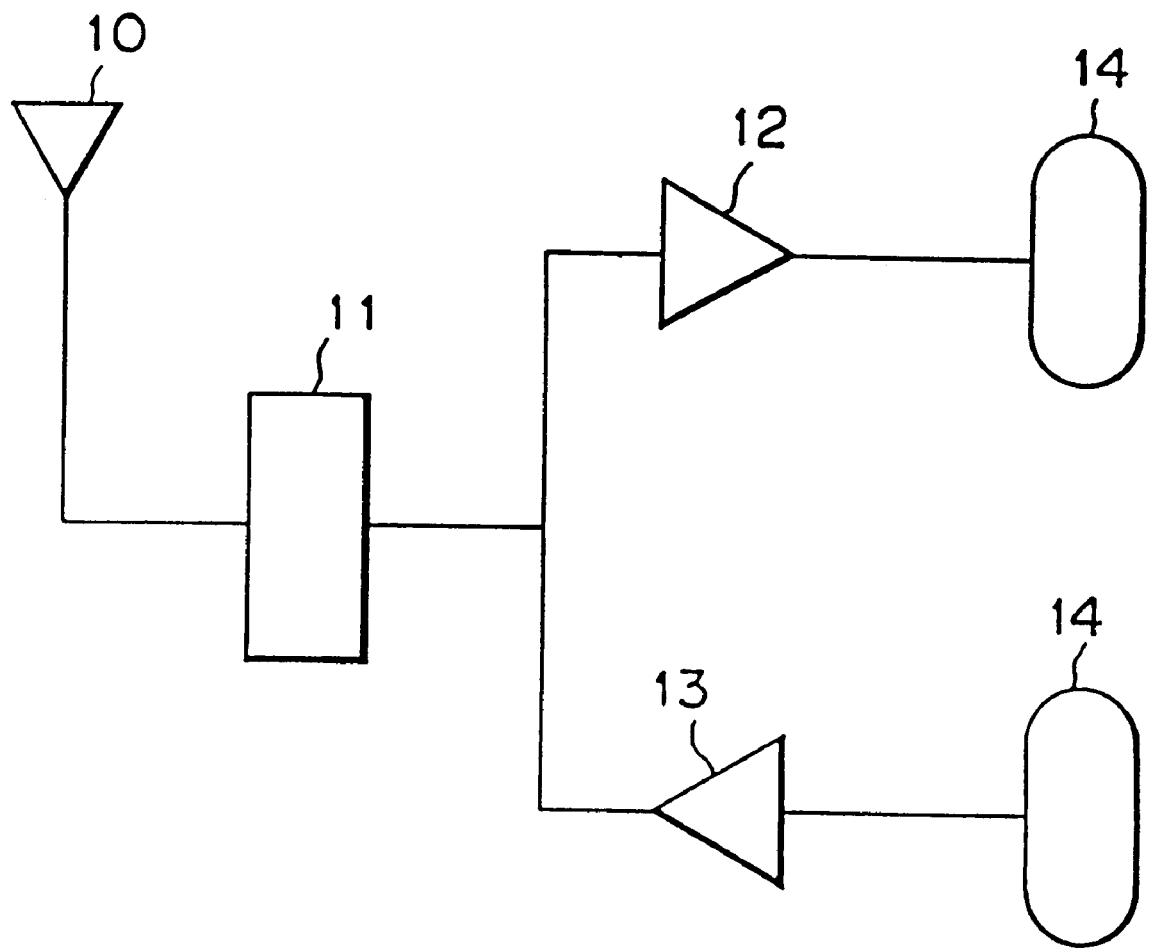
FIG. 7 is a schematic diagram illustrating an RF portion of a portable phone.
Figure 8:
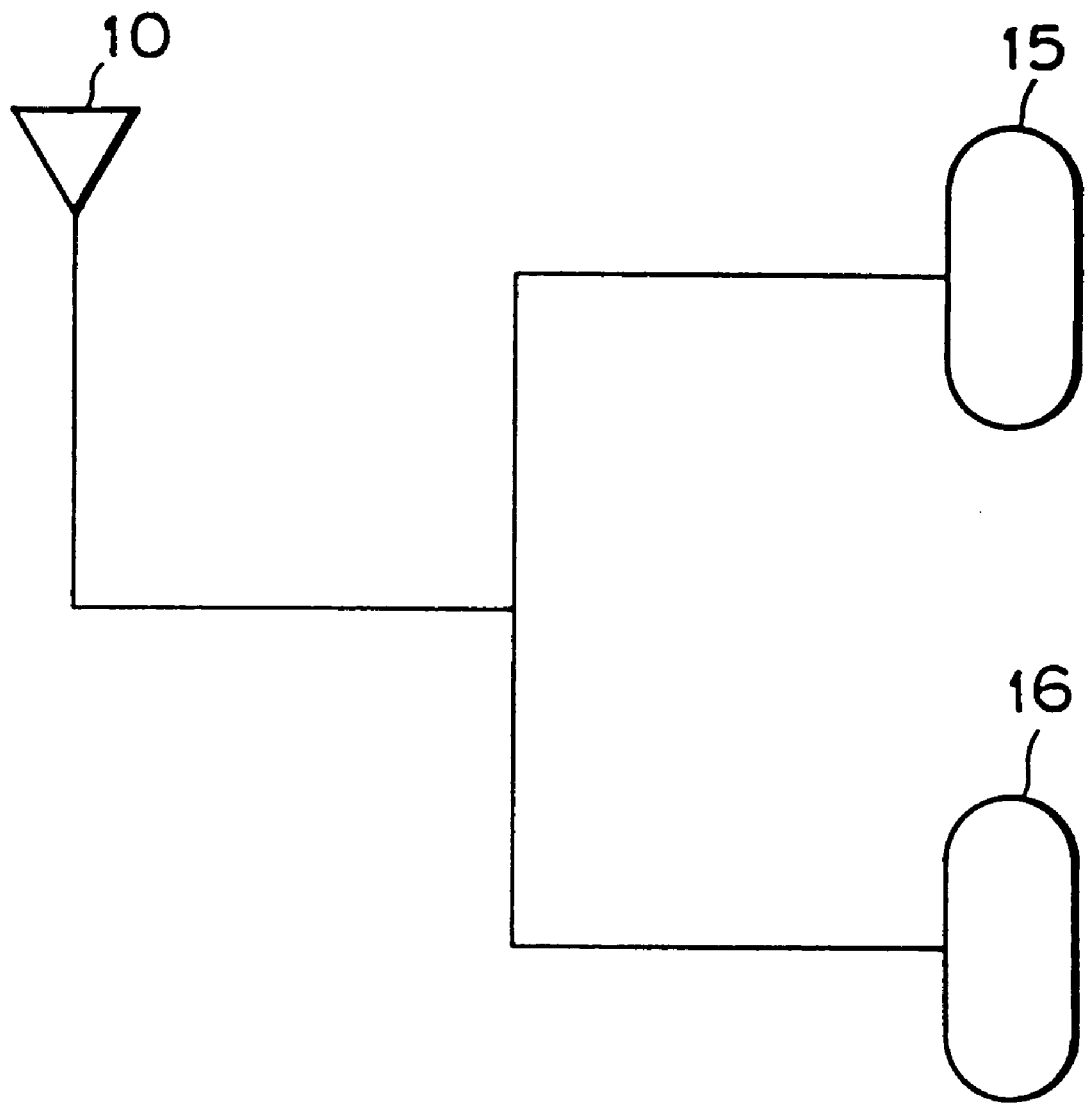
FIG. 8 is a schematic diagram illustrating a transmitting/receiving circuit formed without using a duplexer and amplifiers in accordance with the present invention.

A semiconductor layer was grown on a LiNbO$_3$ substrate of 128 degree Y cut as well as the Embodiment 10. Next, the semiconductor layer was processed to be arranged between input and output electrodes being formed later, and also was etched so as to separate the semiconductor layer into three portions as shown in FIG. 6. Interdigital Al electrodes were formed on the exposed surface of the piezoelectric substrate as input and output electrodes. Electrode pitches and the propagation wavelengths are the same values as those in Embodiment 10. Furthermore, electrodes for applying a direct current electric field was formed on each of the separated active layer.

The characteristics of the surface acoustic wave amplifier of the present invention was evaluated by applying direct current electric field in parallel to each of the active layers. As a result, the amplification gain was 8 dB where a direct current applied voltage was 5 V, and a center frequency was 1,500 MHz. It was confirmed that the enhancement of the amplification gain substantially 3 times as large as that of Embodiment 10 was achieved.

Embodiment 15

Figure 11:
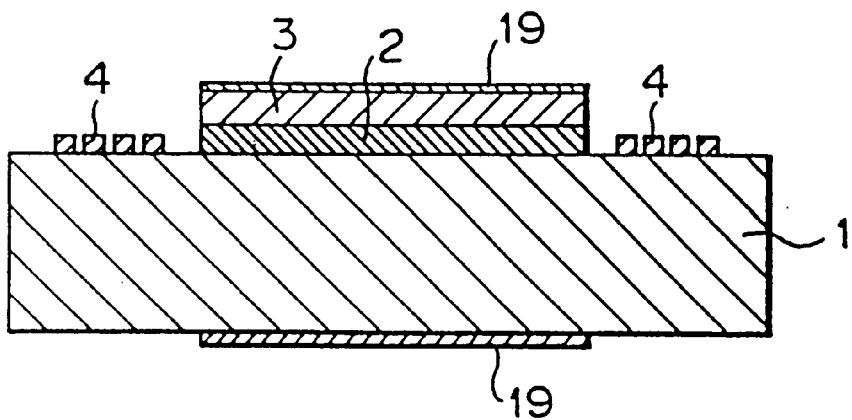
FIG. 11 is a cross sectional view showing a surface acoustic wave convolver in accordance with an embodiment of the present invention.

A surface acoustic wave convolver having a cross sectional structure as shown in FIG. 11 was fabricated.

A semiconductor layer was grown on a LiNbO$_3$ substrate 1 of 128 degree Y cut as in Embodiment 10. Next, a semiconductor layer serving a buffer layer 2 was etched at a predetermined position to expose the piezoelectric substrate 1. Input electrodes 4 were formed on the surface of the piezoelectric substrate 1 by a lithography process. Furthermore, take-out electrodes 19 were formed on the top of the semiconductor and at the bottom of the piezoelectric substrate, as shown in FIG. 11, and a surface acoustic wave convolver was produced.

In addition, using the surface acoustic wave convolver of the present invention, when the amplifying characteristics of frequency of 1,000 MHz was measured by a frequency analyzer, a convolution output as a nonlinear signal could be obtained from the take-out electrode 19.

Embodiment 16

Using the surface acoustic wave amplifier produced in Embodiment 1 of the present invention, a mixer, and a quadrature modulator, the receiving circuit of the RF portion of a portable phone was produced. No specific circuit for matching the impedances was provided between the surface acoustic wave amplifier and the mixer. Normally, for the portion constructed with a low noise amplifier and a high-frequency band pass filter, only the surface acoustic wave amplifier was used. The RF signal which was π/4QPSK modulated was provided from a signal generator to the receiving circuit of the RF portion of the portable phone produced as above described, so that demodulation errors of I and Q output signals after receiving the RF signal were measured by using a vector signal analyzer (Yokokawa Hewlett Packard 89441A). Consequently, when the strength of input signal was between −10 and −102 dBm, the size of the maximum error vector was 16% rms. Moreover, as a result of comparison of input data with demodulated data, there was no error in the data demodulated. Furthermore, the noise figure and amplification gain of the surface acoustic wave amplifier were measured by using a noise figuring meter (Yokokawa Hewlett Packard 8970B) and a noise source (Yokokawa Hewlett Packard 346B). As a result, at 810 MHz, the noise figure was 2.5 dB and the amplification gain was 14 dB; at 826 MHz, the noise figure was 3 dB and the amplification gain was 12 dB; and at 815 MHz, the noise figure was 1.8 dB and the amplification gain was 16 dB. In addition, attenuation characteristics outside of the pass band was measured by using a network analyzer. At 940 MHz, and insertion loss was 35 dB, and at 956 MHz, and insertion loss of 40 dB was measured. In conclusion, it was confirmed that a receiving circuit using the surface acoustic wave amplifier instead of the low noise amplifier and the band pass filter could be achieved. Furthermore, if the surface acoustic wave amplifier of this Embodiment of the present invention was used, a high frequency-low noise amplifier could be made monolithically and resulting in the reduction of the number of the parts of the receiving circuit.

Embodiment 17

The receiving circuit of the RF portion of a portable phone was produced by using an orthogonal modulator, a mixer, a band pass filter and a surface acoustic wave amplifier. Normally, the surface acoustic wave amplifier of the present invention is used as the part to be constructed with a power amplifier. The RF signal which was π/4QPSK modulated is provided from a signal generator to the surface acoustic wave amplifier, so that demodulation errors of the I and Q output signals were measured by using a vector signal analyzer. As a result, the size of an error vector at a center frequency of 948 MHz was 5.5% rms. In this case, a transmission electric power was 2.2 W. It was confirmed that when the spectrum of the output signal was measured by a spectrum analyzer, it met Nippon Digital system automobile telephone system standard normalization (RCR STD-27). In conclusion, it was confirmed that the transmitting circuit could be produced by using the surface acoustic wave amplifier instead of a conventional power amplifier to enable down-sizing of the power amplifier portion.

Embodiment 18

The transmitting circuit of the RF portion of a portable phone similar to that obtained in Embodiment 17 was produced without using a band pass filter. As a result, the size of an error vector at a center frequency of 948 MHz was 4.0% rms. Next, it was confirmed that the transmitting electric power at this time was 3.2 W, and a transmitting spectrum met RCR STD-27. In conclusion, the transmitting circuit can be produced by using the surface acoustic wave amplifier instead of a conventional power amplification module and a band pass filter, so that power amplification and the band pass filter can be made monolithic.

Embodiment 19

A transmitting/receiving circuit was produced by using a surface acoustic wave amplifier with a pass band of 810 to 826 MHz instead of the low noise amplifier of a receiving circuit and the band pass filter and also using a surface acoustic wave amplifier with a pass band of 940 to 956 MHz instead of the power amplifier of a transmitting circuit and the band pass filter. The same surface acoustic wave amplifier of a receiving portion as in Embodiment 16 was used and the same surface acoustic wave amplifier of a transmitting portion as in Embodiment 17 was used. An antenna terminal was connected to a transmitting circuit and a receiving circuit, with a micro-strip line in which the characteristic impedance was adjusted to be 50 ohm without using a duplexer. The receiving characteristics and the transmitting characteristics of the transmitting/receiving circuit produced as described above were measured similarly to Embodiment 16 and Embodiment 17. As a result of measurement of the receiving characteristics, the size of the maximum error vector was 18% rms when the strength of an input signal was between −10 and −102 dBm. Moreover, there was no error in the data demodulated at this time. As a result of measurement of the transmitting characteristics, the size of the error vector at a center frequency of 948 MHz was 5.4% rms. Moreover, it was confirmed that the transmitting electric power at this time was 3.0 W, and a transmitting spectrum met RCR STD-27. In conclusion, it was confirmed that in the transmit-receive circuit of the RF portion of the portable phone, circuits using the surface acoustic wave amplifier can be used instead of the low noise amplifier and the band pass filter, instead of the power amplification module and the band pass filter, and instead of the duplexer. Therefore, when the transmitting/receiving circuit of this Embodiment of the present invention was used, the number of the parts of the RF portion of a conventional portable communication apparatus can be sufficiently reduced, so that it can contribute to drastic down-sizing and weight reduction, as well as price reduction of portable apparatus terminals.

Comparative Embodiment 6

The typical size of a power amplification module constructed with a conventional GaAsFET, a capacitor, etc. is 25 mm×12 mm×3.7 mm. In contrast, the surface acoustic wave amplifier of Embodiment 17 is 5 mm×5 mm×2 mm, so that the present invention can achieve drastic down-sizing of the conventional power amplifier.

The used of the surface acoustic wave functional element of the present invention permits to greatly improve the gain of a surface acoustic wave amplifier or the efficiency of a surface acoustic wave convolver. The surface acoustic wave amplifier of the present invention can achieve a large amplification gain at low voltages which is practically advantageous so that it is applicable to high frequency portions of mobile communication appliances. Furthermore, the present invention permits to use a single component in place of an amplifier, a bandpass filter, or a duplexer which have been used as discrete elements and are of a larger size. Thus, the present invention can contribute to the production of compact, lightweight, thinned mobile communication appliances at low manufacturing costs.

What is claimed:

1. A surface acoustic wave functional element, comprising:

a piezoelectric substrate;

an input electrode and an output electrode formed on said piezoelectric substrate; and semiconductor layers provided between said input electrode and said output electrode, wherein said semiconductor layers include an active layer and a buffer layer, said buffer layer comprises a compound which contains at least antimony and said buffer layer has a lattice constant matched to that of said active layer.

2. The surface acoustic wave functional element as claimed in claim 1, wherein said active layer comprises a compound which contains at least indium.

3. The surface acoustic wave functional element as claimed in claim 1, wherein said active layer has a film thickness that is from 5 nm to 500 nm inclusive.

4. The surface acoustic wave functional element as claimed in claim 1, further comprising a unidirectional transducer for input-output power conversion.

5. The surface acoustic wave functional element as claimed in claim 1, wherein said surface acoustic wave functional element is formed as part of an amplifier and further comprises electrodes for applying a direct current electric field to said semiconductor layer.

6. The surface acoustic wave functional element as claimed in claim 5, wherein said semiconductor layer is divided into two or more blocks between said input and output electrodes and wherein said functional element has an arrangement in which carriers moving in a reverse direction are removed between said input electrode and said output electrode or an arrangement in which no active layer is present between said two or more blocks.

7. The surface acoustic wave functional element as claimed in claim 5, wherein said input and output electrodes are embedded in said buffer layer and said active layer is formed on said buffer layer.

8. The surface acoustic wave functional element as claimed in claim 5, wherein said input and output electrodes have a high withstand power structure.

9. A transmitting/receiving circuit, comprising a surface acoustic wave functional element described in claim 5, formed as an amplifier and a bandpass filter, or as an amplifier, a bandpass filter and a duplexer.

10. The transmitting/receiving circuit as claimed in claim 9, wherein said transmitting/receiving circuit transmits or receives a signal to or from a mobile communication apparatus.

11. A surface acoustic wave functional element comprising:

a piezoelectric substrate; and input and output electrodes formed on said piezoelectric substrate, wherein said piezoelectric substrate comprises a multilayer piezoelectric body comprising at least three layers having at least two different electromechanical coupling coefficients, and wherein a central layer of said at least three layers of said multilayer piezoelectric body has the largest electromechanical coupling coefficients.

12. The surface acoustic wave functional element as claimed in claim 11, wherein said multilayer piezoelectric body consists of three layers, said central layer of said piezoelectric body consists of $LiNbO_3$ and the rest layers of said piezoelectric body consists of $LiTaO_3$.

13. The surface acoustic wave functional element as claimed in claim 11, wherein a unidirectional transducer is used for input-output transducers.

14. The surface acoustic wave functional element as claimed in claim 11, wherein semiconductor layers exist between said input electrode and said output electrode.

15. The surface acoustic wave functional element as claimed in claim 14, wherein said semiconductor layers consist of an active layer and a buffer layer, said buffer layer having a lattice constant match ed to that of said active layer.

16. The surface acoustic wave functional element as claimed in claim 14, further comprising a unidirectional transducer for input-output power conversion.

17. The surface acoustic wave functional element as claimed in claim 14, wherein said surface acoustic wave functional element is formed as part of an amplifier and further comprises electrodes for applying a direct current electric field to said semiconductor layer.

* * * * *